US006629000B1

(12) United States Patent
Moon et al.

(10) Patent No.: US 6,629,000 B1
(45) Date of Patent: Sep. 30, 2003

(54) MPEG PORTABLE SOUND REPRODUCING SYSTEM AND A REPRODUCING METHOD THEREOF

(75) Inventors: Kwang-su Moon, Seoul (KR); Jung-ha Hwang, Seoul (KR)

(73) Assignee: MPMan.com Inc., Seoul (KR)

( * ) Notice: Subject to any disclaimer, the term of this patent is extended or adjusted under 35 U.S.C. 154(b) by 0 days.

(21) Appl. No.: 09/061,647

(22) Filed: Apr. 17, 1998

(30) Foreign Application Priority Data

Nov. 24, 1997 (KR) .......................................... 97-62315

(51) Int. Cl.[7] .............................................. G06F 17/00
(52) U.S. Cl. .......................... 700/94; 710/308; 710/306
(58) Field of Search ............................ 700/94; 704/270, 704/272, 278, 500; 369/31, 63; 360/32, 55; 381/61, 124; 84/601, 602, 604; 710/305, 306, 308, 22, 27

(56) References Cited

U.S. PATENT DOCUMENTS

| 4,475,155 A | * | 10/1984 | Oishi et al. ................. 710/305 |
| 4,912,632 A | * | 3/1990 | Gach et al. ................. 710/308 |
| 5,119,485 A | * | 6/1992 | Ledbetter, Jr. et al. ...... 710/308 |
| 5,339,444 A | | 8/1994 | Nakajima .................... 395/750 |
| 5,359,698 A | | 10/1994 | Goldberg et al. |

(List continued on next page.)

FOREIGN PATENT DOCUMENTS

| DE | 299-10-175 | * | 10/1999 | ................. 700/94 |
| EP | 0 798 929 A | | 10/1997 | |
| JP | 7-307674 | | 11/1995 | |
| JP | 8 205093 A | | 8/1996 | |
| JP | 9-73299 | | 3/1997 | |
| JP | 10-320000 | * | 12/1998 | ................. 704/500 |
| KR | 10-1991-11772 A | | 2/1992 | |
| KR | 10-1995-35692 A | | 5/1997 | |
| WO | WO 96 08006 A | | 3/1996 | |
| WO | WO 97 26744 A | | 7/1997 | |

OTHER PUBLICATIONS

Jay Wampold, Progressive Networks and Audible Inc. Team Up to Make RealAudio Mobile (Sep. 15, 1997).
Audible, Inc., Audible MobilePlayer and MobilePlayer–Plus User's Guide, pp. 1–7 (1997).
ITT Semiconductors, Catalogue of MAS 3503 C (Single–chip solution for audio data decompression with MPEG Layer 3 Method), pp. 1–8 (Feb. 1995).

*Primary Examiner*—Xu Mei
(74) *Attorney, Agent, or Firm*—Nath & Associates PLLC; Harold L. Novick

(57) ABSTRACT

Disclosed is an MPEG portable sound reproducing system and a method for reproducing sound data compressed using the MPEG method. The inventive system includes power supply means for supplying operational power to the system, the power supply means being realized through a secondary battery; power processing means for rectifying power supplied from the power supply means to stable voltage and current; information display means for displaying numbers and combinations of letters related to operational states of the system; control means for controlling all operations of converting and reproducing sound data compressed using the MPEG method; data storage means for storing MPEG-compressed sound data in a designated address according to signals output from the control means; information selecting means for selecting general operations to reproduce, download, and apply selected sound data stored in the data storage means; sound reproducing means for converting sound data stored in the data storage means into a format audible to users according to signals output from the control means; and transmitting/receiving means for transmitting and receiving sound data and program data from external devices.

9 Claims, 6 Drawing Sheets

U.S. PATENT DOCUMENTS

| | | |
|---|---|---|
| 5,491,774 A | 2/1996 | Norris et al. |
| 5,623,623 A | 4/1997 | Kim et al. |
| 5,694,332 A * | 12/1997 | Maturi .......................... 700/94 |
| 5,724,609 A * | 3/1998 | Hatae et al. ................. 710/305 |
| 5,748,835 A * | 5/1998 | Lee ............................. 386/104 |
| 5,809,245 A | 9/1998 | Zenda ..................... 395/200.47 |
| 5,857,114 A * | 1/1999 | Kim ............................. 710/308 |
| 5,980,262 A * | 11/1999 | Tseng et al. ............. 434/307 A |
| 6,032,081 A * | 2/2000 | Han et al. ...................... 700/94 |
| 6,078,742 A * | 6/2000 | Chow .......................... 710/308 |
| 6,108,743 A * | 8/2000 | Debs et al. .................. 710/308 |
| 6,122,699 A * | 9/2000 | Omo et al. .................. 710/131 |
| 6,311,092 B1 * | 10/2001 | Yamada ....................... 381/61 |
| 2001/0047267 A1 * | 11/2001 | Abiko et al. ................. 704/500 |

\* cited by examiner

MPEG PORTABLE SOUND REPRODUCING SYSTEM AND A REPRODUCING METHOD THEREOF

BACKGROUND OF THE INVENTION (a) Field of the Invention

The present invention relates to a portable sound reproducing system and method, and more particularly, to a portable sound reproducing system and a reproducing method thereof in which sound data, compressed using the Moving Picture Experts Group (MPEG) method and stored in a memory device, is converted into an audible format and output through headphones, speakers, etc.

(b) Description of the Related Art

Generally, data processed to be listened or viewed is stored in a memory medium then output through a reproduction device. The most common examples include analog data stored on magnetic tape which is output through a cassette player, and digital data stored on a compact disc which is output through a compact disc player.

Recent developments in digital technology has enabled memory media used in personal computers to undergo vast improvements. Namely, memory media used in PCs are becoming increasingly lightweight and compact, and providing the user with more capacity to store memory.

However, with the increase in required memory needed to run operating systems and application software, there is a limit to how efficiently memory media can be used. In an attempt to remedy this problem, a variety of methods have been devised to enable the efficient use of digital data. The MPEG standard is one of these methods which increases the storage capacity of memory media by compressing data stored therein.

Namely, by using the MPEG method of compressing data, data is compressed to roughly one-twelfth its original size without compromising sound or visual quality. After compresing data utilizing software or hardware made for this purpose, the data is then stored in a storage medium, then converted back into its original state using the MPEG method such that the data is placed in a form that can be heard or seen by the user. The MPEG method, therefore greatly increases data storage capacity.

With all the conventional sound reproduction systems, i.e., tape players and compact disc players, and PCs, etc. which are equipped with the capability to reproduce MPEG-compressed data, many disadvantages are encountered by the user.

In particular, in using cassette players, which reproduce data stored on magnetic tape, because the same amount of time is needed to store (record) data as it does to reproduce (play) the data, the storing process is time-consuming, and heat generated during the process acts to deteriorate the quality of the recording such that the quality of the sound reproduced is decreased. Moreover, because magnetic tape is easily worn, the repetitive playing of data stored on the cassette tape also acts to reduce sound quality.

Compact disc players and the discs used therein also have many problems. Namely, recording is not possible on compact discs. Further, because of the mechanical fragility of CD players, reproduction malfunctions occur when the players receive even slight outside shocks. Finally, CD players have a limited life span as the mechanical parts in the devices often break over time.

The storage media used in cassette and CD players also have the drawback of occupying much space. Also, users must take great care that the storage media are placed in an area that is not exposed to heat, direct sunlight, etc.

With regard to prior art devices such as PCs used to reproduce data stored using the MPEG method, as these devices are not portable, the location at which users can access the sound and images is limited to the location of the device. In addition, when using a PC to reproduce data compressed using the MPEG method, the cost of equipping the PC with software or hardware to enable this function is high. Also, because various types of sound data are stored on a plurality of storage media, the user must purchase many kinds of storage media and undergo complicated processes to reproduce the data stored therein.

Finally, in all of the above cases, users must physically go to retail stores to purchase storage media, causing inconvenience to the user.

SUMMARY OF THE INVENTION

The present invention has been made in an effort to solve the above problems. It is an object of the present invention to provide an MPEG portable sound reproducing system and a reproducing method thereof which reproduces sound data, compressed and stored on a memory chip using the MPEG method, into an audible format.

It is another object of the present invention to provide an MPEG portable sound reproducing system which, by storing data on a semiconductor storage medium, prevents heat from generating during recording as in the prior art cassette tape player, and avoids damage from exposure to heat as with conventional cassette tapes, compact discs, and other storage media.

It is still yet another object of the present invention to provide an MPEG portable sound reproducing system which enables connection to telecommunications networks and data vending machines such that various data can be downloaded, thereby enabling users to enjoy the benefits-speed, convenience, variety, etc.- of these systems.

It is still yet another object of the present invention to provide an MPEG portable sound reproducing system in which data downloaded via telecommunications networks and data vending machines as in the above is able to be accessed by and saved on a personal computer.

It is still yet another object of the present invention to provide an MPEG portable sound reproducing system which does not require separate storage media as with cassette players and compact disc players such that the device can be made to be lightweight and thin, and the need for physical storage space of the storage media is not needed.

To achieve the above objects, the present invention provides an MPEG portable sound reproducing system and a method for reproducing sound data compressed using the MPEG method. The inventive system includes power supply means for supplying operational power to the system, the power supply means being realized through a secondary battery; power processing means for rectifying power supplied from the power supply means to stable voltage and current; information display means for displaying numbers and combinations of letters related to operational states of the system; control means for controlling all operations of converting and reproducing sound data compressed using the MPEG method; data storage means for storing MPEG-compressed sound data in a designated address according to signals output from the control means; information selecting means for selecting general operations to reproduce, download, and apply selected sound data stored in the data storage means; sound reproducing means for converting sound data stored in the data storage means into a format audible to users according to signals output from the control means; and transmitting/receiving means for transmitting and receiving sound data and program data from external devices.

The inventive sound reproducing method includes the steps of initializing the system and detecting a state of a flash ROM when power is supplied to information selecting means; loading a main program from the flash ROM, if it is detected that the state of the flash ROM is normal, and completing booting of required software; and downloading and reproducing stored sound data, if the set up of the operational environment is completed, according to signals output from the information selecting means, a state of operational power, and whether connection is made to an external power supply and to external telecommunications systems, etc.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

Preferred embodiments of the present invention will now be described in detail with reference to the accompanying drawings.

Figure 1:
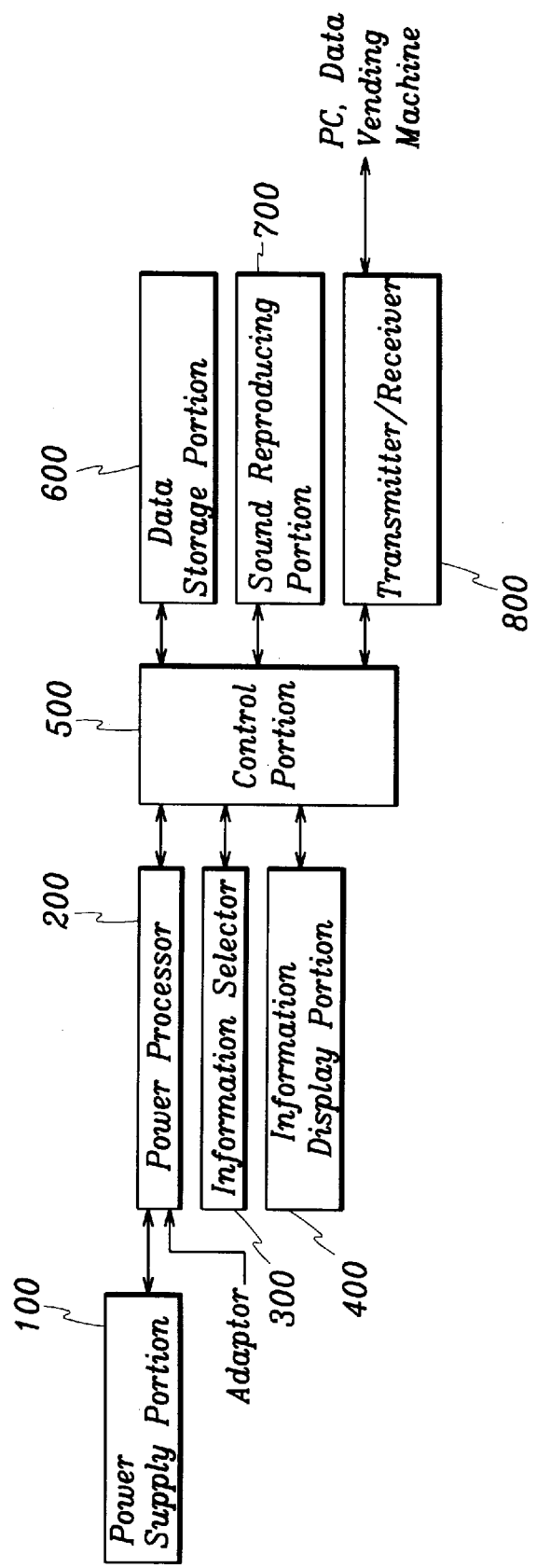
FIG. 1 is a block diagram of an MPEG portable sound reproducing system according to a preferred embodiment of the present invention.

Referring first to FIG. 1, an inventive MPEG portable sound reproducing system comprises a power supply portion 100, a power processor 200, an information selector 300, an information display portion 400, a control portion 500, a data storage portion 600, a sound reproducing portion 700, and a transmitter/receiver 800.

The power supply portion 100 is realized through a nickel-cadmium (Ni—CD), nickel-metal hydride (Ni—MH), lithium-ion, or lithium-polymer secondary battery, and converts chemical energy into electrical energy for supply of the same to the portable sound reproducing system. Also, the power supply portion 100 is recharged by electricity received through an adaptor.

The power processor 200 receives power from the power supply portion 100 or directly through the adaptor, rectifies the power to stable voltage current, and supplies the power to the control portion 500 as drive power. When receiving power through the adaptor, the power processor 200 supplies power to the power supply portion 100 for recharging the same.

The information selector 300 is realized through various predetermined keys operated by the user, and outputs electrical signals according to the user selections to control the supply of power, extract data for reproduction, control various functions related to the reproduction of data, and transmit and receive data.

In more detail, the information selector 300 comprises a forward switch for advancing to a subsequent selection when pressed for under a predetermined amount of time of preferably under one second, and which quickly plays data when continually pressed for a predetermined amount of time of preferably over one second; a reverse switch for returning to a beginning of a present selection if the selection is in mid-play or reversing to a previous selection if between selections when pressed for under a predetermined amount of time of preferably under one second, and which quickly plays data in reverse when continually pressed for a predetermined amount of time of preferably over one second; a play/stop switch for reoproducing data when pressed one time, and, in a state of reproducing data, discontinuing the present play mode when pressed again, then cutting off the power; a repeat switch for replaying the present selection when pressed one time, repeating all selections when pressed two times, and cancelling all repeat commands when pressed for a predetermined time of preferably over three seconds; and a random switch for randomly reproducing the selections in a random order when pressed.

The information display portion 400 is realized through an LCD (liquid crystal display) and displays various numbers and letters related to the various modes realized through the above switches.

Figure 2:
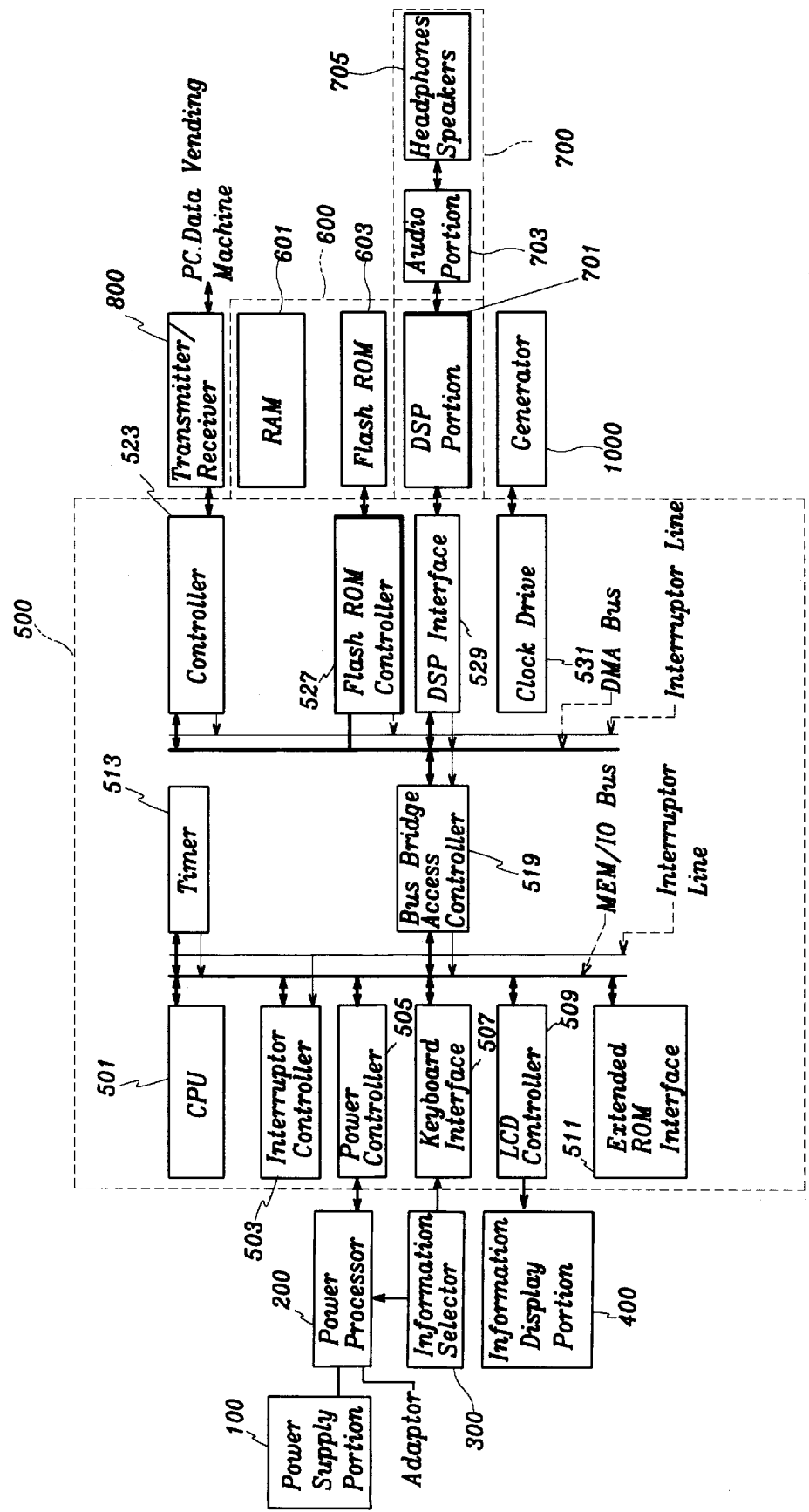
FIG. 2 is a detailed block diagram of the MPEG portable sound reproductin system of FIG. 1.
Figure 3A:
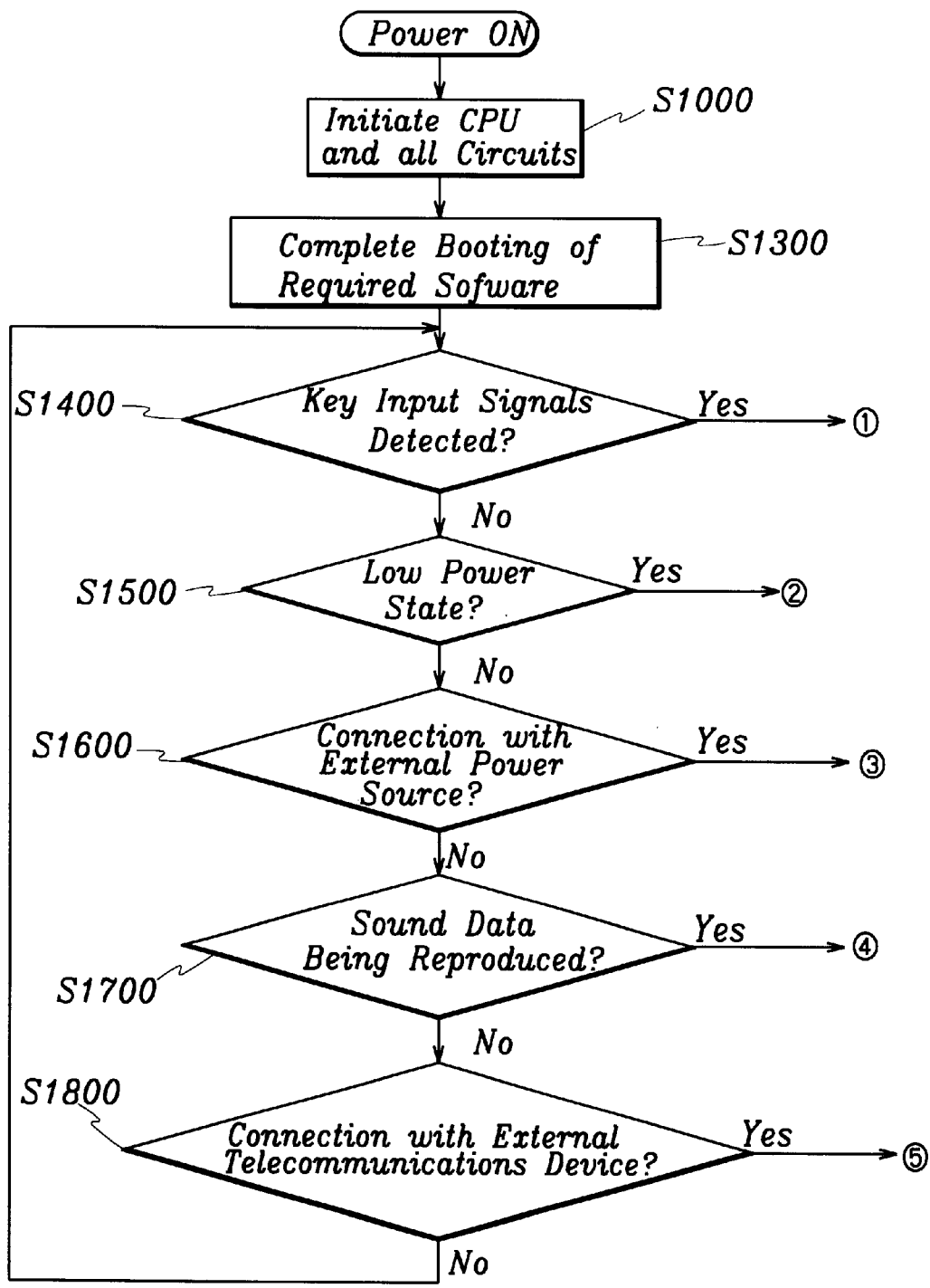
FIGS. 3a–3f are flow charts of a reproducing method for an MPEG portable sound reproducing system according to a preferred embodiment of the present invention.
Figure 3B:
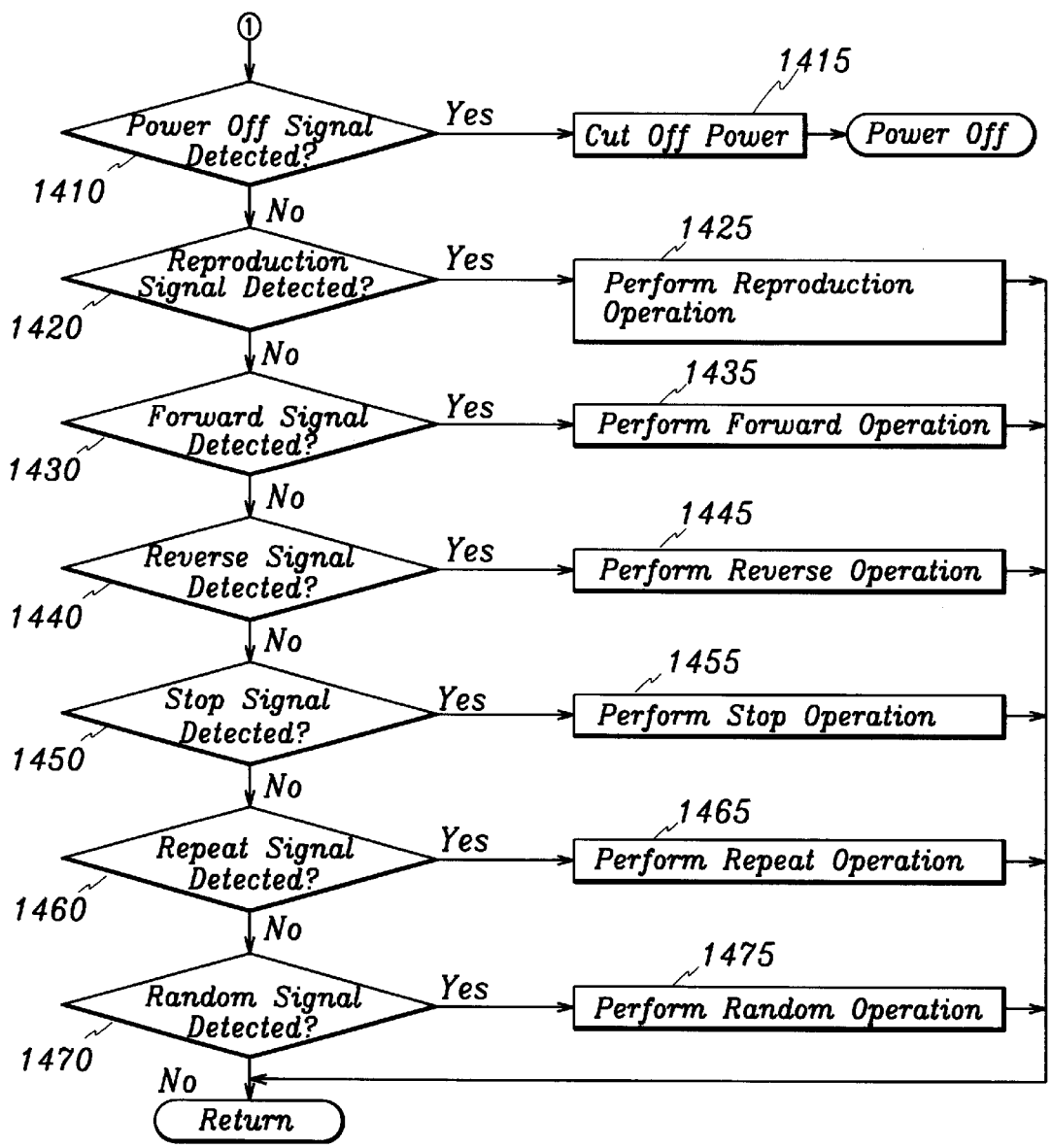
Figure 3C:
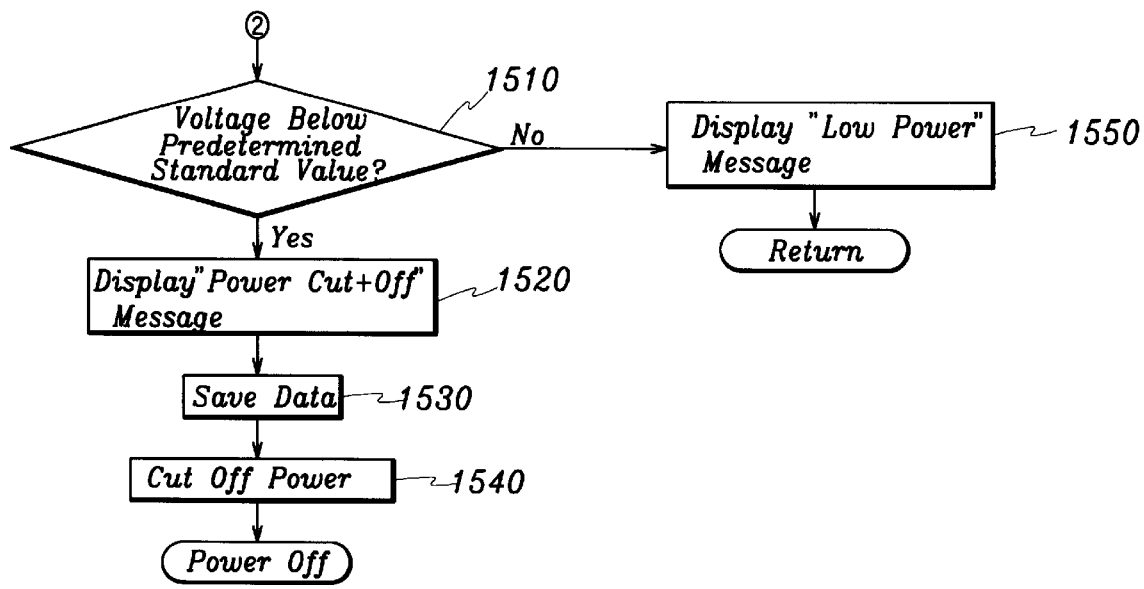
Figure 3D:
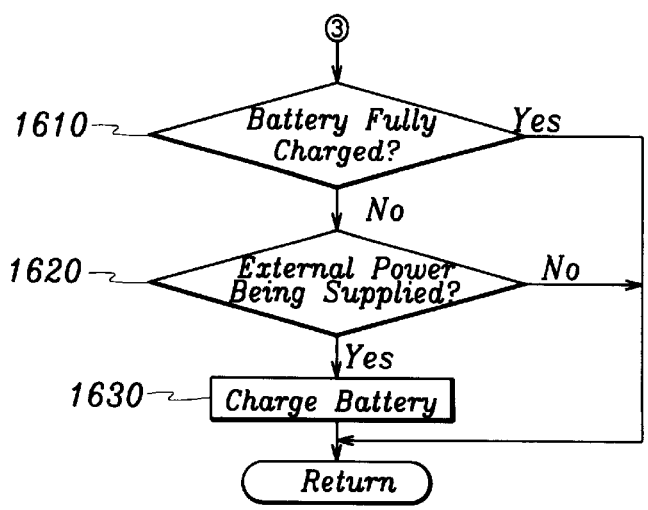
Figure 3E:
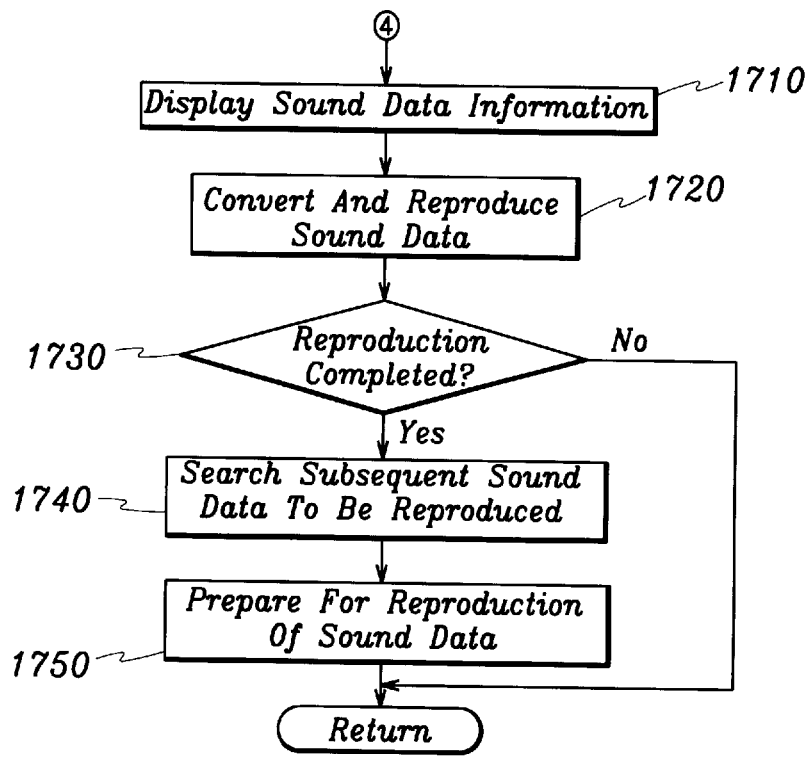
Figure 3F:
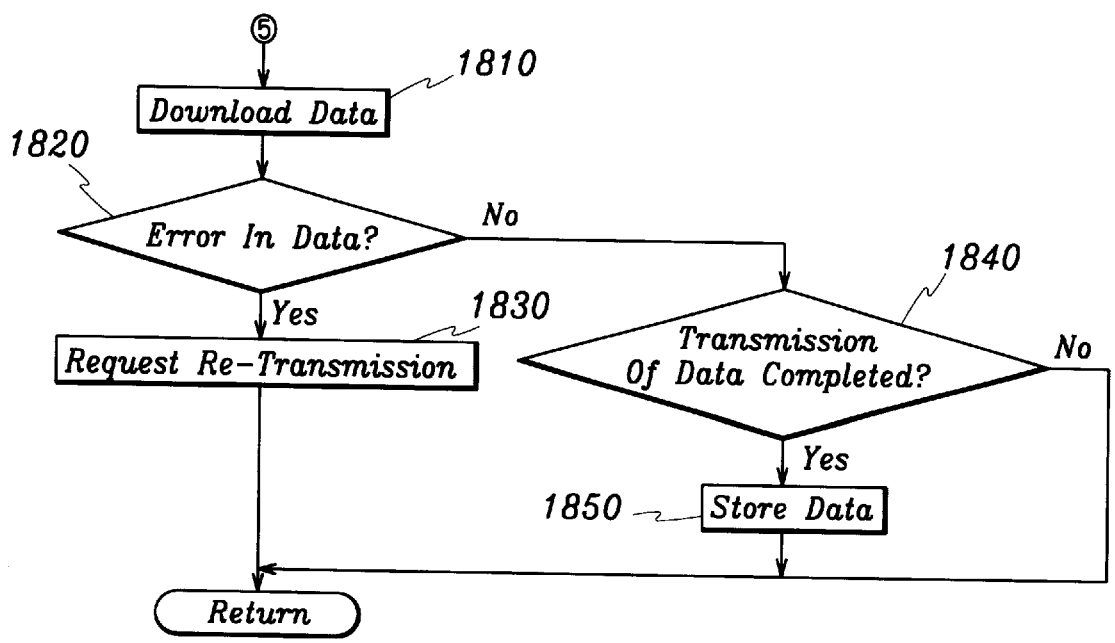

The control portion 500 controls all the various operations for storing and reproducing sound data compressed using the MPEG method. The control portion 500, as shown in FIG. 2, comprises a CPU (central processing unit) 501 for controlling operations related to converting digital data stored using the MPEG method into an audible format; an interrupter controller 503 for outputting a control signal to control the CPU 501 when an input/output operation is ended or an error occurs in the same; a power controller 505 for outputting control signals to stably supply power applied from the power processor 200 as operational power of the CPU 501, and cutting off power when an error occurs; a keyboard interface 507 for interfacing key select signals applied from the information selector 300; an LCD controller 509 for controlling electric current supplied to a matrix of the information display portion 400 to control display during operation of the inventive sound reproducing system; an extended ROM interface 511 for interfacing a with an extended ROM, added to extend a scope of programs or memory, and a flash memory; a timer 513 for counting time information needed for data downloading and reproducing the downloaded data, and data interrupting required to operate the system; a bus bridge access controller 519 outputting control signals for controlling a bus, the bus transmitting data; a controller 523 for controlling input/output of data transmitted and received; a flash ROM controller 527 for activating the flash ROM 603 according to interrupter control signals applied from the CPU 501; a DSP (digital signal processor) interface 529 outputting control signals for controlling an input/output of digital sound data compressed by the MPEG method; and a clock drive 531 which processes a generator clock of a generator 1000 to a predetermined state and drives the same to the CPU 501 as clock signals.

All the above elements of the control portion 500 are connected through a combination of an interrupt line and an I/O bus.

The data storage portion 600 stores sound data compressed using the MPEG method downloaded through the transmitter/receiver 800 according to signals from the control portion 500. Further, as shown in FIG. 2, the data storage portion 600 is realized through the flash ROM 603, which is a volatile memory element that does not lose data when the power is cut off, for storing and erasing sound data, and data related to application software and other digital data.

The sound reproducing portion 700 converts sound data stored in the data storage portion 600 into an audible format according to signals applied from the control portion 500. The sound reproducing portion 700, as shown in FIG. 2, comprises a DSP portion 701 for returning digital sound data compressed using the MPEG method to its initial state, an audio portion 703 which converts sound signals input from the DSP portion 701 into an audible format, and headphones/speakers 705 for converting electric sound signals input from the audio portion 703 into sound able to be heard by users.

The transmitter/receiver 800 is connected to a PC, data vending machine, or other such external devices and either transmits sound or program data thereto or receives sound or program data therefrom. A preferred reproducing method of data compressed using the MPEG method for the portable sound reproducing system structured as in the above will be described hereinafter with reference to FIGS. 3a–3f.

First, if the user presses an ON switch of the information selector 300 to reproduce and listen to particular sound data among all the digital data compressed using the MPEG method and stored in the data storage portion 600, the CPU 501 of the control portion 500 enters an operational mode by receiving power via the power processor 200 from the power supply portion 100 or adaptor (S1000).

Next, the CPU 501 runs the main program and completes booting of required software (S1300), then determines if key signals of the information selector 300, input through the keyboard interface 507 and the MEM/IO bus, are detected (S1400).

If key signals are detected in step S1400, it is determined if there is a power OFF selection signal, selected by the user to cut off power supplied from the power processor 200 (S1410). If the power OFF signal is detected, operational power applied from the power processor 200 is cut off and the system is put in a standby mode (S1415).

If no power OFF signal is detected in step S1400, it is detected if there has been an input of a sound reproduction signal for restoring and reproducing a selection of data compressed using the MPEG method and stored in the flash ROM 603 of the data storage portion 600 (S1420).

If it is determined in step 1420 that the key signal is a reproduction key signal to reproduce sound data stored in the data storage portion 600, the CPU 501 loads the selected sound data to the DSP portion 701 of the sound reproducing portion 700 via the DSP interface 529 of the control portion 500, then returns the digital sound data compressed using the MPEG method to its original state using operating systems software, converts the data into an electric sound signal through the audio portion 703 of the sound reproducing portion 700, and converts the electric signal into a sound signal audible to the user and outputs the same through headphones/speakers 705 (S1425).

In step 1420, if it is detected that the key select signal is not a signal for reproducing sound data or if the system is currently reproducing data, it is then detected if a forward signal has been input (S1430). If a forward key signal is detected in step S1430, the CPU 501 determines if the forward select signal; is transmitted for under a predetermined amount of time of less than one second, which if this criterion is met, then advances the selection to the next selection and executes a reproducing operation, and also determines if the forward select signal is transmitted for over a predetermined amount of time of more than one second, and if it is, the present selection is reproduced at a fast speed (S1435).

In step S1430, if a forward key signal is not detected, it is determined if a reverse key signal has been input (S1440). If it has, the current selection being reproduced is either returned to the beginning, or if between selections, a selection is made to the preceding song if the reverse signal is transmitted for under a predetermined time of preferably under one second, or the present playing selection is quickly reversed if the. reverse signal is transmitted for over a predetermined amount of time of preferably over one second (S1445).

If a reverse signal is not detected in step 1440, it is then detected if a stop signal has been input (S1450). Here, if a stop signal is detected, it is further determined, using an installed program, if a signal of a predetermined number of times of preferably one time has been input and the present mode is the play mode, in which case the present reproduction operation is discontinued, an if in a stopped mode reproduction is started. Further, in a state where the play mode has been disontinued, if it is detected that the stop signal is transmitted for a predetermined amount of time of preferably more than three seconds, standby power is controlled to OFF (S1455).

In step S1450, if a stop signal is not detected or if it is determined that the system is in a play mode, it is then determined if a repeat signal has been input (S1460). If a repeat signal is detected, the number of input times is determined using an installed program such that the present selection is repeated when it is detected that the signal has been input a predetermined number of times of preferably one time, all sound data stored in the memory of the flash ROM 603 is repeated when the input of two signals is detected, and any repeat command is cancelled when it is detected that the signal is input during a repeat operation (S1465).

Further, if no repeat signal is detected in, step 1460, it is then determined if a random signal has been input (S1470). If a random signal is detected in this step, selections are reproduced in random order (S1475), and if a random signal is not detected, the operation to reproduce the sound data compressed using the MPEG method is repeated.

In the above state where sound data selected by the user is being reproduced according to key signals input from the information selector 300, operational power is analyzed in the power processor 200 to determine if a Low Power state exists, disenabling a reproduction operation to be performed, in the power supply portion 100 (S1500). If it is determined that the power supply portion 100 is in a Low Power state in step 1500, it is then determined if the detected present voltage is below a predetermined standard value that would impede the normal reproducing of sound data (S1510).

In the above, if it is determined that the voltage of the power supply portion 100 is less than the predetermined standard value, the control portion 500 outputs a predetermined control signal for display of a warning to the LCD controller 509 via the MEM/IO bus. Here, the LCD controller 509 adjusts power supplied to the matrix of the information display portion 400 such that a "power cut off" message is displayed thereon (S1520).

Simultaneously with the displaying of the "power cut off" message, the CPU 501 of the control portion 500 inputs a data storage signal to the flash ROM 603 of the data storage portion 600 such that the present state is saved (S1530), and controls the power controller 505 via the MEM/IO bus to cut off the supply of power to the power processor (S1540).

In step 1510, if it is determined that the voltage of the power supply portion 100 is above the predetermined standard value, enabling the normal operation of the system, the control portion 500 controls the information display portion 400 via the LCD controller 509 such that a "Low Power" message is displayed (S1550).

After the checking of the power state in step S1500, the CPU 501 of the control portion 500 determines if the power processor 200 is connected to an external power source through the adaptor (S1600). If it is detected that there is a connection with an external power source in step S1600, it is then determined if the power supply portion 100 is fully charged (S1610).

In the above, if it is determined that the power supply portion 100 is fully charged, the charging operation is discontinued, to prevent damage to the power supply portion 100 caused by overcharging, and if it is determined that the power supply portion 100 is not fully charged, it is then determined if power from an external power source is being supplied through the adaptor (S1620). Here, if external power is being supplied in a state where the power supply portion 100 is not fully charged, the power is then supplied to the power supply portion 100 to charge the same (S1630).

After step 1600, where it is determined if there is a connection with an external power source, it is then determined if sound data is being reproduced according to selections made by the user at the information selector 300 (S1700). If sound data is being reproduced in this step, the CPU 501 of the control portion 500 analyzes the sound data- checking, for example, data reproduction time, title of selection, type of music, remaining play time for the selection, etc.- and displays the information through the information display portion 400 by controlling the LCD controller 509 (S1710).

Further, the CPU 501 of the control portion 500 accesses the sound data compressed using the MPEG method in the flash ROM 603 of the data storage portion 600, and transmits this sound data to the DSP portion 701 of the sound reproducing portion 700 through the DSP interface 529. Accordingly, the DSP portion 701 processes the MPEG-compressed digital sound data to a predetermined state and converts it to sound signals via the audio portion 703, then reproduces the sound data through headphones/speakers 705 such that the user can listen to the sound (S1720).

Next, it is determined if the selected sound data has been completely reproduced (S1730). If it has, a subsequent sound data selection is searched from the flash ROM 603 (S1740), then sound data to be reproduced is loaded from the flash ROM 603 and preparations are made to reproduce sound data (S1750).

After step S1700, where it is determined if sound data is being reproduced, the CPU 501 of the control portion 500 analyzes signals from the controller 523 to determine if the transmitter/receiver 800 is connected to an external telecommunications system of, for example, a computer having a modem or other telecommunications device installed therein, or a data vending machine selling a variety of data and programs of music, video games, etc. (S1800).

If it is determined in step 1800 that the transmitter/receiver 800 is connected to an external telecommunications system, the inventive system is changed to a downloading load, the data is downloaded (S1810), and it is determined if an error exists in the downloaded data (S1820).

In the above, if it is determined that an error exists in the downloaded data, the CPU 501 of the control portion 500 performs control so that the data is re-transmitted, and if no error exists in the data, the data is stored (S1830). Further, if it is determined that no error exists in the transmitted data in step 1820, the CPU 501 determines if transmission of the data is completed (S1840), designates an address sphere in the data storage portion 600, then downloads and stores the data (S1850).

In the MPEG portable sound reproducing system structured and reproducing MPEG-compressed data as in the above, as sound data is compressed using the MPEG method and stored in a semiconductor chip or other memory element, then reproduced in a format audible to the user, convenience is provided by eliminating the need for records, tapes, CDs, and other such memory media, and many of the drawbacks of using memory media in prior art reproduction devices- reduction in sound quality after recording or repeated playing, fragility of memory media necessitating the need to take great care in storing the same, etc.- are overcome.

Further, because it is possible to connect the inventive system to telecommunications networks and data vending machines to download various data, benefits of speed, convenience, and low cost are provided to the user.

Other embodiments of the invention will be apparent to the skilled in the art from consideration of the specification and practice of the invention disclosed herein. It is intended that the specification and examples be considered as exemplary only, with the true scope and spirit of the invention being indicated by the following claims.

What is claimed is:

1. A portable sound reproducing system for reproducing compressed digital sound data into an audible audio signal, comprising:

a Direct Memory Access (DMA) Bus across which a received compressed digital sound data is stored and across which the stored sound data is accessed to be reproduced;

a MEM/IO Bus across which a control data signal is provided to control operations on said DMA Bus;

a Bus Bridge Access Controller interposed between said DMA Bus and said MEM/IO Bus that selectively controls operations on said DMA Bus to selectively store the received compressed digital sound data and to selectively resume an operation to reproduce the stored sound data in accordance with the control signal from said MEM/IO Bus;

a CPU connected to said MEM/IO Bus that controls operations related to conversion of the stored sound data into an audible format;

an interrupter controller connected to said MEM/IO Bus that outputs a further control signal to control the CPU when an input/output operation is ended or an error occurs in the CPU;

a power controller connected to said MEM/IO Bus to stably supply power from a power processor as operational power to the CPU, and for cutting off the power when an error occurs;

a keyboard interface connected to said MEM/IO Bus that interfaces key select signals applied from an information selecting means;

an LCD controller connected to said MEM/IO Bus that controls electric current supplied to a matrix of an information display means to control a display during operation of the sound reproducing system;

an extended ROM interface connected to said MEM/IO Bus that interfaces a connection with an extended ROM that can be added to extend a scope of programs or memory; and a timer connected to said MEM/IO Bus that counts time information needed for receiving a data download and for reproducing the downloaded data, and data interrupting required to operate the system.

2. The sound reproducing system of claim 1, further comprising:

a transmitter/receiver whereby the system is adapted to be connected to an external source of the compressed digital sound data;

a controller connected between said transmitter/receiver and said DMA Bus that controls input/output of transmitted and received compressed digital data;

a flash ROM controller connected to said DMA Bus that activates a flash ROM according to interrupter control signals applied from a CPU; and a DSP interface connected to said DMA Bus that outputs control signals that control the input/output of compressed digital sound data that has been compressed by a data compression method.

3. The sound reproducing system of claim 2 wherein said data compression method is an MPEG compression method.

4. The sound reproducing system of claim 2, further comprising:

a DSP portion connected to said DSP interface that processes the compressed digital sound data to a predetermined state; and an audio portion connected to said DSP portion which converts audio signals input from the DSP portion into an audible format.

5. The sound reproducing system of claim 1, further comprising:

a RAM, which is a volatile memory element that loses data when power is cut off, for loading application software and temporarily storing the same while a reproducing operation is being executed after power is supplied to the system; and a flash ROM, which is a volatile memory element that does not lose data when the power is cut off, for storing and erasing sound data, and data related to application software and other digital data.

6. The sound reproducing system of claim 1, further comprising:

a power supply that supplies operational power to the system, the power supply being realized through a secondary battery;

a power processor that rectifies power supplied from the power supply to stabilize voltage and current;

an information display that displays numbers and combinations of letters related to operational states of the system;

control means for controlling all operations of converting and reproducing the compressed sound data;

data storage means for storing the compressed sound data in a designated address according to signals output from the control means;

an information selector for selecting general operations to reproduce, download, and apply a selected sound data stored in the data storage means;

a sound reproducing means for converting the selected sound data into a format audible to users according to signals output from the control means; and a transmitting/receiving means for transmitting and receiving compressed digital sound data and program data to and from external devices.

7. The sound reproducing system of claim 6, wherein the power processor supplies charging current to the secondary battery of the power supply when the power processor receives external power through an adapter.

8. The sound reproducing system of claim 6, wherein the information selector comprises:

a forward switch for advancing to a subsequent selection when pressed for under second, and which quickly plays a present selection when continually pressed for over one second;

a reverse switch for returning to a beginning of the present selection if the selection is in mid-play or reversing to the previous selection if between selections when pressed for under one second, and which quickly plays data in reverse when continually pressed for a predetermined amount of time of over one second;

a play/stop switch reproducing data when pressed one time, and in a play mode, discontinuing a play mode when pressed then cutting off the power;

a repeat switch for replaying the present selection when pressed one time, repeating all selections when pressed two times, and canceling all repeat commands when continually pressed; and a random switch for randomly reproducing the selections in a random order when pressed.

9. A portable sound reproducing system for reproducing compressed digital sound data into an audible audio signal, comprising:

a Direct Memory Access (DMA) Bus across which a received compressed digital sound data is stored and across which the stored sound data is accessed to be reproduced;

a MEM/IO Bus across which a control data signal is provided to control operations on said DMA Bus;

a Bus Bridge Access Controller interposed between said DMA Bus and said MEM/IO Bus that selectively controls operations on said DMA Bus to selectively store the received input sound data and to selectively resume an operation to reproduce the stored sound data in accordance with the control signal from said MEM/IO Bus;

a transmitter/receiver whereby the system is adapted to be connected to an external source of the compressed digital sound data;

a controller connected between said transmitter/receiver and said DMA Bus that controls input/output of transmitted and received digital sound data;

a DSP interface connected to said DMA Bus that outputs control signals that control the input/output of compressed digital sound data that has been compressed by a data compression method;

a CPU connected to said MEM/IO Bus that controls operations related to conversion of the stored sound data into an audible format;

a flash ROM controller connected to said DMA Bus that activates a flash ROM according to interrupter control signals applied from the CPU;

an interrupter controller connected to said MEM/IO Bus that outputs a further control signal to control the CPU when an input/output operation is ended or an error occurs in the CPU;

a power controller connected to said MEM/IO Bus to stably supply power from a power processor as operational power to the CPU, and for cutting off the power when an error occurs;

a keyboard interface connected to said MEM/IO Bus that interfaces key select signals applied from an information selecting means;

an LCD controller connected to said MEM/IO Bus that controls electric current supplied to a matrix of an information display means to control a display during operation of the sound reproducing system;

an extended ROM interface connected to said MEM/IO Bus that interfaces a connection with an extended ROM that can be added to extend a scope of programs or memory; and a timer connected to said MEM/IO Bus that counts time information needed for receiving a data download and for reproducing the downloaded data, and data interrupting required to operate the system.

* * * * *